(12) United States Patent
Cho

(10) Patent No.: US 7,560,300 B2
(45) Date of Patent: Jul. 14, 2009

(54) METHOD OF MANUFACTURING IMAGE SENSOR

(75) Inventor: In Bae Cho, Gyeonggi-do (KR)

(73) Assignee: Dongbu HiTek Co., Ltd., Seoul (KR)

( * ) Notice: Subject to any disclaimer, the term of this patent is extended or adjusted under 35 U.S.C. 154(b) by 170 days.

(21) Appl. No.: 11/614,566

(22) Filed: Dec. 21, 2006

(65) Prior Publication Data

US 2007/0148809 A1    Jun. 28, 2007

(30) Foreign Application Priority Data

Dec. 28, 2005    (KR) ................ 10-2005-0132101

(51) Int. Cl.
*H01L 21/00*    (2006.01)
(52) U.S. Cl. ........................................... 438/70
(58) Field of Classification Search ............... 438/706, 438/693, 641, 70, 58, 57; 257/291; 252/392
See application file for complete search history.

(56) References Cited

U.S. PATENT DOCUMENTS

| | | | |
|---|---|---|---|
| 4,474,684 A * | 10/1984 | Roos et al. ............... 252/392 |
| 5,143,855 A * | 9/1992 | Pace et al. ............... 438/70 |
| 6,410,447 B2 * | 6/2002 | Pai et al. ............... 438/706 |
| 6,825,120 B1 * | 11/2004 | Liu et al. ............... 438/693 |
| 6,861,686 B2 * | 3/2005 | Lee et al. ............... 257/291 |
| 2005/0003659 A1 * | 1/2005 | Markowitz et al. ............ 438/641 |

* cited by examiner

*Primary Examiner*—Davienne Monbleau
*Assistant Examiner*—Monica D Harrison
(74) *Attorney, Agent, or Firm*—Sherr & Vaughn, PLLC

(57) ABSTRACT

A method of manufacturing an image sensor, which avoids corroding a pad electrode with overexposure to corrosive chemicals, includes forming a pad electrode over a semiconductor substrate, forming a passivation layer over the pad electrode, applying a photoresist over the passivation layer, etching the photoresist and passivation layer to form a via hole exposing the pad electrode, and applying an amine based chemical for a predetermined, limited time to remove the photoresist. Alternatively, an amide based chemical which does not corrode the pad electrode can be substituted for the amine based chemical.

10 Claims, 4 Drawing Sheets

METHOD OF MANUFACTURING IMAGE SENSOR

The present application claims priority under 35 U.S.C. 119 and 35 U.S.C. 365 to Korean Patent Application No. 10-2005-0132101 (filed on Dec. 28, 2005), which is hereby incorporated by reference in its entirety.

BACKGROUND

In general, image sensors are semiconductor devices for converting an optical image into an electrical signal. Among types of image sensors, a CMOS image sensor is a device employing a switching mode to sequentially detect an output by providing photodiodes corresponding to the number of pixels through a CMOS technology that uses peripheral devices, such as a control circuit and a signal processing circuit.

In manufacturing the image sensor various efforts have been made to improve the photosensitivity of the image sensor.

The CMOS image sensor is composed of a pixel array unit including photodiodes for sensing light and a CMOS logic circuit for processing the detected light into electrical signals, to convert them into data. In order to improve photosensitivity, either the area occupied by the photodiodes must be increased, or a photo-gathering technology must be used to collect more light in the photodiode area by focusing the light path and forming a micro-lens over the upper portion of the photodiodes.

SUMMARY

Embodiments relate to a method of manufacturing an image sensor which effectively removes a photoresist used therein.

Embodiments relate to a method of manufacturing an image sensor, capable of preventing pad corrosion and pit formation from occurring because of chemicals used therein.

Embodiments relate to a method of manufacturing an image sensor, including preparing a semiconductor substrate having a pixel array section and a logic circuit section. A pad electrode is formed in the logic circuit section.

A passivation layer is formed over a top surface of the semiconductor substrate. A photoresist layer is applied over the passivation layer. A photo-etching process removes the passivation layer over the pad electrode, patterning the photoresist layer and forming a via hole exposing the pad electrode. A color photoresist is applied over the passivation layer in the pixel array section, and patterned to form a color filter layer.

N,N-dimethyl acetamide is sprayed to remove the color photoresist. The color photoresist is reworked over the passivation layer in the pixel array section.

A planarizing layer is formed over the color filter layer. Micro-lenses are formed over the planarizing layer.

BRIEF DESCRIPTION OF DRAWINGS

Example

DETAILED DESCRIPTION

Figure 1A:
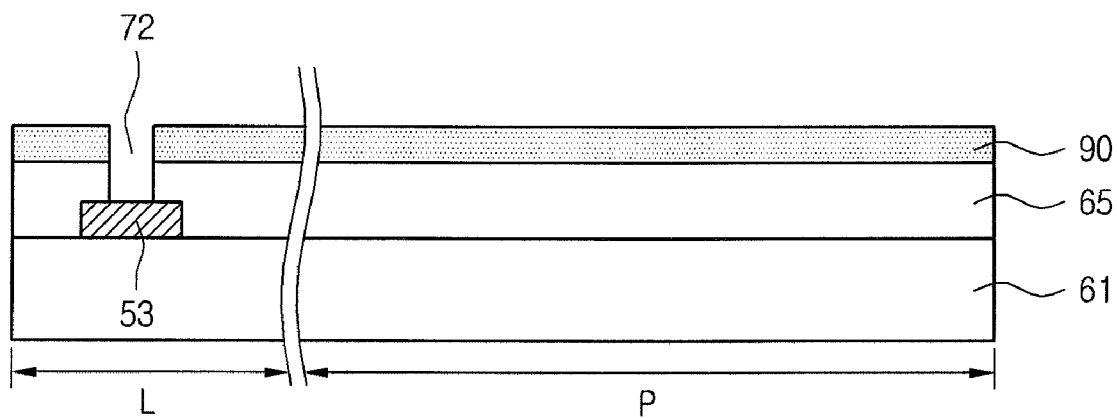
FIGS. 1A to 1C are sectional views illustrating processes of a method of manufacturing an image sensor according to embodiments; and Example

As illustrated in FIG. 1A, an interlayer insulating layer 61 is formed by depositing an oxide layer over a semiconductor substrate (not shown) having a pixel array section P and a logic circuit section L, and is planarized by a chemical mechanical polishing (CMP) process. At this time, various interconnections, transistors, and photodiodes can be provided on the substrate.

A metallic material, for example aluminum, is deposited over the interlayer insulating layer 61 by sputtering, and is patterned by a photo-etching process. In this way, a pad electrode 53 is formed in the logic circuit section L.

Another oxide layer is deposited over a top surface of the substrate including the pad electrode 53, and is polished by the CMP process. Then, a passivation layer 65 is formed.

A photoresist layer 90 is applied to the pad electrode and the passivation layer 65, and patterned by photo-etching. The passivation layer 65 over the pad electrode 53 is etched using the patterned photoresist 90 as a mask, thereby forming a via hole 72. The via hole 72 is for connecting the pad electrode 53 with an external driving circuit.

After the via hole 72 is formed, the photoresist 90 is removed.

In the case of a color image sensor product, in order to remove the photoresist in the process of forming the via hole, N,N-dimethyl acetamide (CH3CON(CH3)2), and N,N-bis (92-hydroxyethyl)-N-cyclohexylamine CH2CH2NH2) are used.

However, in the case in which the photoresist 90 is removed using N,N-bis(92-hydroxyethyl)-N-cyclohexylamine, the pad may form pits and look as if it is torn. This pad the pit phenomenon happens because a fluorine (F) component in the removal process with N,N-bis(92-hydroxyethyl)-N-cyclohexylamine corrodes the pad electrode.

In the process of removing the photoresist after the via hole is formed, the chemical selected can make a remarkable difference in the condition of the pad electrode 53. This depends on the characteristics of the chemical. Because N,N-dimethyl acetamide, a chemical based on fluorine, contains the same fluorine component as the pad electrode, it does not affect the pad. However, in the case of using N,N-bis(92-hydroxyethyl)-N-cyclohexylamine, a chemical based on amine, the pad corrodes due to the chemical reaction with aluminum in the pad electrode.

Therefore, in order to remove the photoresist in the process of forming the via hole, N,N-dimethyl acetamide is used instead of N,N-bis(92-hydroxyethyl)-N-cyclohexylamine.

Figure 1B:
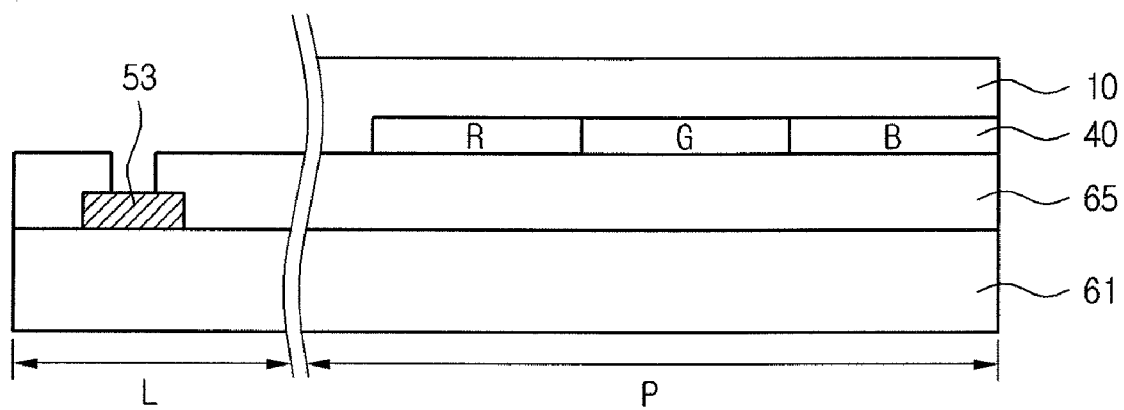

Subsequently, as illustrated in FIG. 1B, a color photoresist is applied to the top surface of the substrate including the passivation layer 65. Part of the color photoresist is selectively removed by the photo-etching process, thereby forming a color filter layer having a pattern in the pixel array section P.

When the color filter layer is not formed in a desired pattern or at a desired position, N,N-dimethyl acetamide is used to remove the color photoresist. This is because, when N,N-dimethyl acetamide is used, no damage is caused to the pad electrode 53 exposed through the via hole 72.

In this manner, after the previous color filter layer is removed, in order to form a new color filter layer, a new color photoresist is applied to the substrate, and is patterned to form a color filter layer 40 having a desired pattern.

Next, a planarizing layer 10 is formed over the color filter layer 40.

Figure 1C:
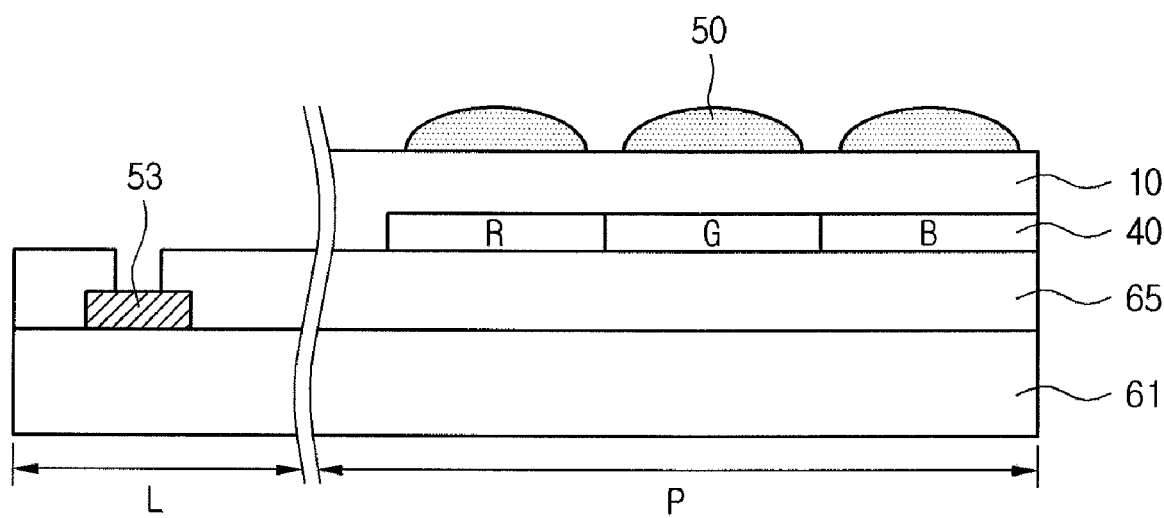

As illustrated in FIG. 1C, a photoresist is applied to the planarizing layer 10, and is patterned into a trapezoidal shape by a photo-etching process using a mask. Then, the photoresist pattern is reflowed to round off corners thereof, thereby forming micro-lenses 50.

Figure 2A:
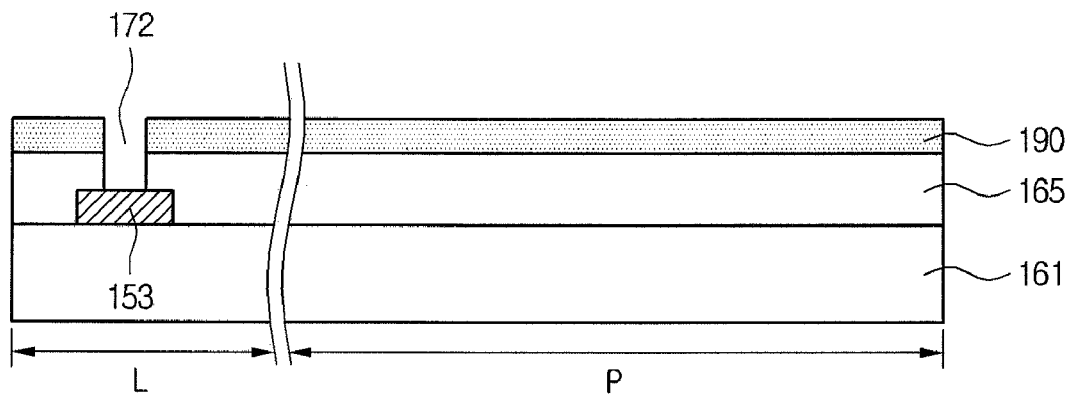
FIGS. 2A to 2E are sectional views illustrating processes of a method of manufacturing an image sensor according to embodiments.

As illustrated in FIG. 2A, an interlayer insulating layer 161 is formed by depositing an oxide layer over a semiconductor substrate (not shown) divided into a pixel array section P and a logic circuit section L. The interlayer insulating layer 161 is planarized by a chemical mechanical polishing (CMP) process.

The substrate can be formed thereon with interconnections formed in a multi-layer structure and electrically connected to each other through contact plugs, transistors controlling a signal, and R, G, and B photodiodes sensing red (R), green (G), and blue (B) signals.

Afterwards, a metallic material, for example aluminum, is deposited over the interlayer insulating layer 161 by sputtering. Silicon nitride (SiN or SiON) may be deposited over the metallic material by means of physical vapor deposition (PVD), chemical vapor deposition (CVD), or atomic layer deposition (ALD). Then, the two materials, the metallic material and the silicon nitride, are simultaneously patterned by a photo-etching process. In this way, a pad electrode 153 is formed in the logic circuit section L.

The pad electrode 153 is formed only in the logic circuit unit (L). Since the pad electrode 153 is a power interconnection that receives signals from an external driving circuit, the thickness thereof is large. As an example, while the metal interconnection provided between interlayer insulating layers might be 1,500 to 4,000 Å thick, the pad electrode formed in the logic circuit unit might be 3,000 to 5,000 Å thick.

A barrier layer may be formed under the pad electrode. The barrier layer may be selected from a TiN/Ti stacked layer, or a layer of Ta, TaN, WN, TaC, WC, TiSiN, and TaSiN.

An oxide layer is deposited over the entire surface including the pad electrode 153. The surface of the oxide layer is polished by the CMP process to form a protective layer 165. The protective layer 165 may be made thick in order to remove a step difference between the pixel array unit and the logic circuit unit that is caused by the pad electrode. In order to prevent the pad electrode 153 from being polished, the CMP process is stopped 3,000 Å to 5,000 Å away from the pad electrode. Therefore, the protective layer 165 formed over the interlayer insulating layer 161 has a thickness of 8,000 Å to 14,000 Å.

A photoresist 190 is applied to the pad electrode 153 and the passivation layer 165, and then is patterned by a photo-etching process. Then, the passivation layer 165 over the pad electrode 153 is etched using the patterned photoresist 190 as a mask, thereby forming a via hole 172 for connecting the pad electrode with the external driving circuit.

After the via hole 172 is formed, the photoresist 190 is removed.

In order to remove the photoresist 190 in the process of forming the via hole 172, an amine based chemical, i.e. N,N-bis(92-hydroxyethyl)-N-cyclohexylamine, is used. Here, the amine based chemical is sprayed within a range where no pad pit occurs at the pad electrode, thereby completely removing the photoresist 190. As the person having skill in the art will realize, the amine based chemical may be applied by alternatives to spraying.

However, when N,N-bis(92-hydroxyethyl)-N-cyclohexylamine is sprayed for a long time, pad pits form in the pad electrode. For this reason, the amine based chemical is sprayed so that the pad corrosion does not occur.

Spraying the amine based chemical for between 270 and 330 seconds, the photoresist 190 can be completely removed without causing damage to the pad electrode.

Figure 2B:
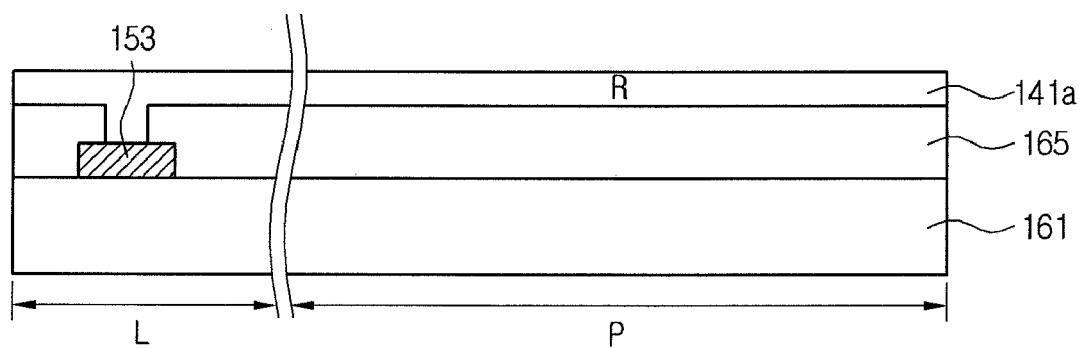
Figure 2C:
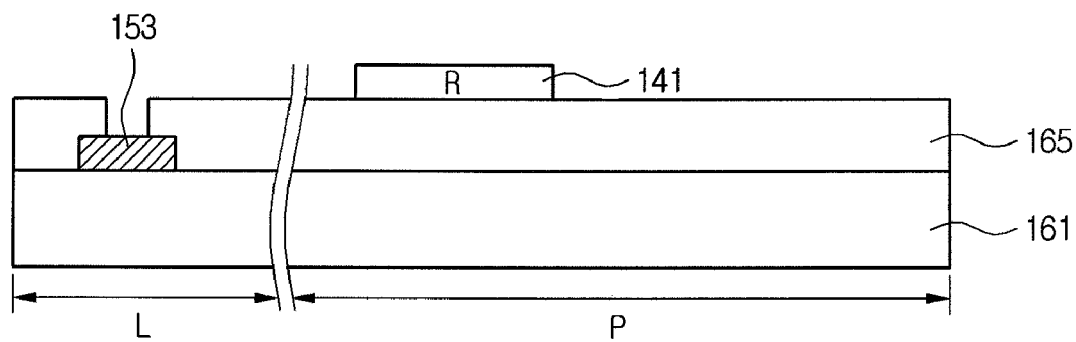

As illustrated in FIG. 2B, an R-color photoresist 141a having a red color is applied to the top surface of the substrate including the passivation layer 165. Part of the R-color photoresist 141a is selectively removed by the photo-etching process, thereby forming an R-color filter layer 141 having a desired pattern in the pixel array section P as illustrated in FIG. 2C.

Figure 2D:
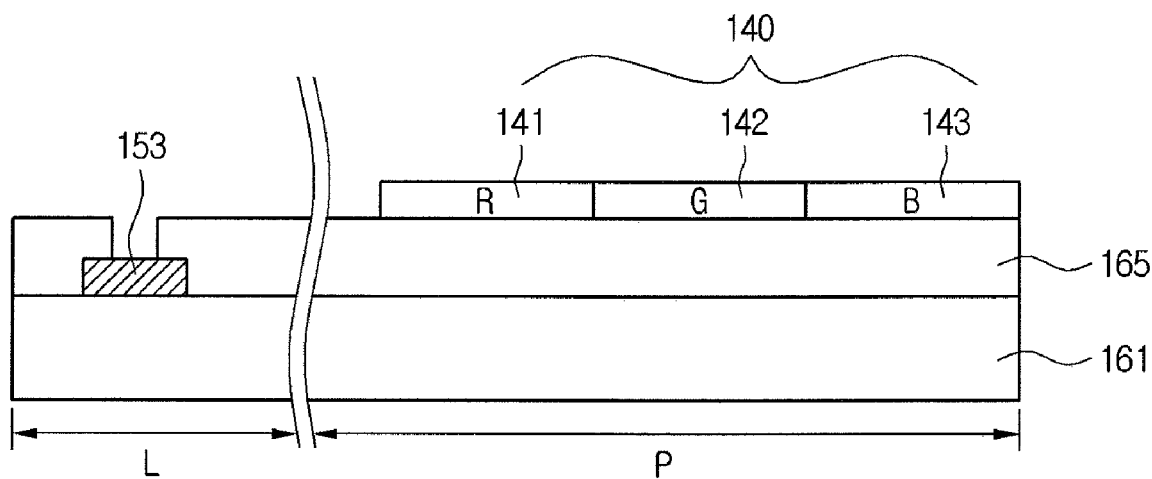

Similarly, a G-color filter layer 142 having a green color, and a B-color filter layer 143 having a blue color are formed, as illustrated in FIG. 2D. Thereby, the color filter layer 140 is completed.

However, when the color filter layer is not formed in a desired pattern or at a desired position, a new color filter layer must be formed by removing the color photoresist.

In order to remove the color filter layer, the amine based chemical, N,N-bis(92-hydroxyethyl)-N-cyclohexylamine, is used. The amine based chemical is sprayed for a limited duration so that no pits are formed in the pad electrode, while completely removing the color filter layer.

However, if N,N-bis(92-hydroxyethyl)-N-cyclohexylamine is sprayed for a long time, pits are formed in the pad electrode. Therefore, the amine based chemical is sprayed under a condition that the pad pit does not occur.

Spraying the amine based chemical for between 270 and 330 seconds, the color filter layer can be completely removed without causing damage to the pad electrode.

After the previous color filter layer is removed, a new color photoresist is applied to the substrate, and is patterned to form a color filter layer 140 having a desired pattern.

Figure 2E:
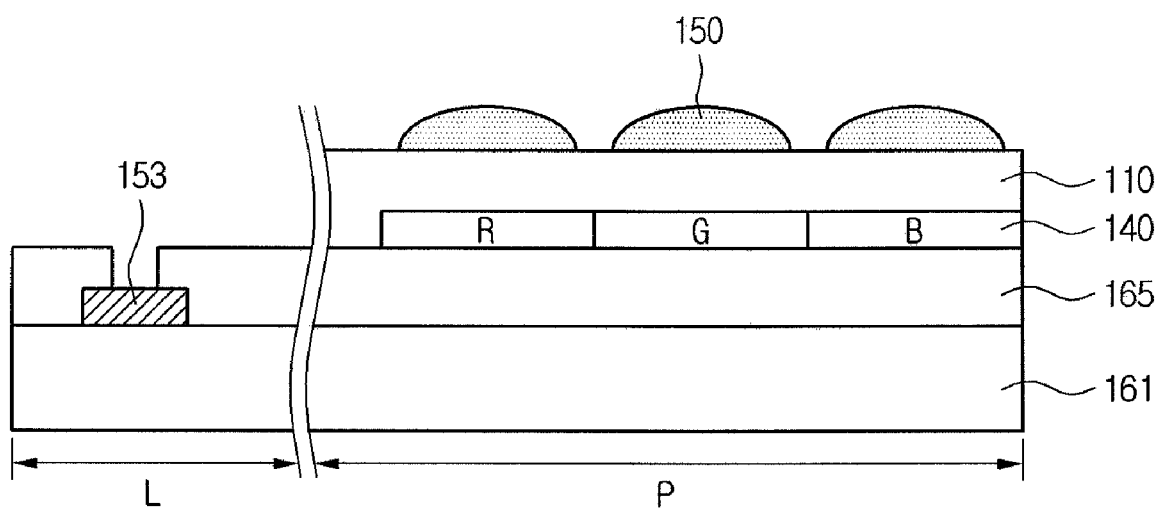

Next, as illustrated in FIG. 2E, a planarizing layer 110 is formed over the color filter layer 140.

Finally, a plurality of micro-lenses 150 are formed over the planarizing layer 110 so as to correspond to the color filter layers 140, respectively.

Each micro-lens must be formed in a pattern similar to a convex lens in order to bend light towards the photo diode. To this end, the photo-etching process is applied to performing patterning.

More specifically, a photoresist as a material for the micro-lens is applied to the planarizing layer 110, and is covered with a mask. The photoresist is exposed using a defocus phenomenon, and thus is patterned in a trapezoidal shape.

Then, the trapezoidal photoresist pattern is heated up to a melting point thereof, and thus is reflowed. This reflow process allows the photoresist pattern to have fluidity and assume a round profile. Thereby, the micro-lenses 150 are completed.

Then, although not illustrated, the external driving circuit is connected to the pad electrode through the via hole. Because the pad electrode is not corroded or eroded, the connection is made without defects.

The method of manufacturing an image sensor in accordance with embodiments has the following advantages.

The process of removing a previous color filter layer in order to rework the new color filter layer must be performed. An amine based chemical is sprayed for 270 to 330 seconds, to thereby completely remove the previous color filter layer without causing damage to the pad electrode.

During reworking the color filter layer, residues of the color photoresist may remain on the substrate. This would prevent the image sensor from being operated. To compensate, the chemical spray time is adjusted, and thereby the color photoresist can be completely removed.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:

1. A method of manufacturing an image sensor comprising:
   forming a pad electrode above a semiconductor substrate;
   forming a passivation layer over the pad electrode;
   applying a photoresist over the passivation layer;
   etching the photoresist and passivation layer to form a via hole exposing the pad electrode; and
   applying an amine based chemical to remove the photoresist, wherein the chemical comprises N,N-bis(92-hydroxyethyl)-N-cyclohexylamine.

2. The method of claim 1, wherein the amine based chemical is applied for a duration between 270 to 330 seconds.

3. The method of claim 1, wherein the amine based chemical is applied by spraying.

4. A method of manufacturing an image sensor comprising:
   preparing a semiconductor substrate having a pixel array section and a logic circuit section;
   forming a pad electrode in the logic circuit section;
   forming a passivation layer over a top surface of the semiconductor substrate;
   applying a photoresist over the passivation layer;
   patterning the photoresist using a photo-etching process to remove the passivation layer over the pad electrode, thereby forming a via hole exposing the pad electrode;
   applying a color photoresist over the passivation layer in the pixel array section, and patterning the color photoresist to form a color filter layer;
   spraying an amine based chemical to remove the color photoresist, wherein the chemical includes N,N-bis(92-hydroxyethyl)-N-cyclohexylamine;
   reworking the color photoresist over the passivation layer in the pixel array section;
   forming a planarizing layer over the color filter layer; and
   forming micro-lenses over the planarizing layer.

5. The method of claim 4, wherein the photoresist is removed by spraying the amine based chemical for a time from 270 to 330 seconds.

6. The method of claim 4, the color photoresist is removed by spraying the amine based chemical for a time from 270 to 330 seconds.

7. The method of claim 4, wherein the passivation layer includes an oxide layer.

8. The method of claim 4, wherein the pad electrode is formed by depositing a metallic material by sputtering, depositing a silicon nitride material, and patterning the deposited material.

9. The method of claim 4, wherein the micro-lenses are formed by applying another photoresist layer, patterning the photoresist layer using a defocus technique, and reflowing the patterned photoresist.

10. A method of manufacturing an image sensor comprising:
    preparing a semiconductor substrate having a pixel array section and a logic circuit section;
    forming a pad electrode in the logic circuit section;
    forming a passivation layer over a top surface of the semiconductor substrate;
    applying a photoresist layer over the passivation layer;
    patterning the photoresist layer using a photo-etching process to remove the passivation layer over the pad electrode, and forming a via hole exposing the pad electrode;
    applying a color photoresist over the passivation layer in the pixel array section, and patterning the color photoresist to form a color filter layer;
    spraying N,N-dimethyl acetamide to remove the color photoresist;
    reworking the color photoresist over the passivation layer in the pixel array section;
    forming a planarizing layer over the color filter layer; and
    forming micro-lenses over the planarizing layer.

* * * * *